US007932532B2

(12) United States Patent
Pickard et al.

(10) Patent No.: US 7,932,532 B2
(45) Date of Patent: Apr. 26, 2011

(54) SOLID STATE LIGHTING DEVICE WITH IMPROVED HEATSINK

(75) Inventors: Paul Kenneth Pickard, Morrisville, NC (US); Nicholas W. Medendorp, Jr., Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 12/535,353

(22) Filed: Aug. 4, 2009

(65) Prior Publication Data

US 2010/0133578 A1 Jun. 3, 2010

(51) Int. Cl.
*H01L 33/00* (2010.01)
(52) U.S. Cl. ...................... 257/98; 257/99; 257/E33.075
(58) Field of Classification Search .................... 257/98, 257/99, E33.075; 362/294, 373
See application file for complete search history.

(56) References Cited

U.S. PATENT DOCUMENTS

| | | | | |
|---|---|---|---|---|
| 4,679,118 | A * | 7/1987 | Johnson et al. ............... | 361/718 |
| 7,224,047 | B2 | 5/2007 | Carberry et al. | |
| 7,456,499 | B2 | 11/2008 | Loh et al. | |
| 7,564,180 | B2 | 7/2009 | Brandes | |
| 2006/0098440 | A1 | 5/2006 | Allen | |
| 2008/0012036 | A1 | 1/2008 | Loh et al. | |
| 2008/0074883 | A1 | 3/2008 | Li | |
| 2008/0278950 | A1 | 11/2008 | Pickard et al. | |
| 2008/0290353 | A1 | 11/2008 | Medendorp, Jr. et al. | |
| 2010/0155746 | A1 | 6/2010 | Ibbetson | |

OTHER PUBLICATIONS

Co-pending U.S. Appl. No. 12/479,318.
Co-pending U.S. Appl. No. 12/498,856.
Co-pending U.S. Appl. No. 12/769,354.

* cited by examiner

*Primary Examiner* — Minh-Loan T Tran
(74) *Attorney, Agent, or Firm* — Vincent K. Gustafson; Hultquist IP

(57) ABSTRACT

A solid state lighting device includes a device-scale stamped heatsink with a base portion and multiple segments or sidewalls projecting outward from the base portion, and dissipates all steady state thermal load of a solid state emitter to an ambient air environment. The heatsink is in thermal communication with one or more solid state emitters, and may define a cup-like cavity containing a reflector. At least a portion of each one sidewall portion or segment extends in a direction non-parallel to the base portion. A dielectric layer and at least one electrical trace may be deposited over a metallic sheet to form a composite sheet, and the composite sheet may be processed by stamping and/or progressive die shaping to form a heatsink with integral circuitry. At least some segments of a heatsink may be arranged to structurally support a lens and/or reflector associated with a solid state lighting device.

20 Claims, 11 Drawing Sheets

SOLID STATE LIGHTING DEVICE WITH IMPROVED HEATSINK

FIELD OF THE INVENTION

The present invention relates to solid state lighting devices, and heat transfer structures relating to same.

DESCRIPTION OF THE RELATED ART

Solid state light sources may be utilized to provide white light (e.g., perceived as being white or near-white), and have been investigated as potential replacements for white incandescent lamps. Light perceived as white or near-white may be generated by a combination of red, green, and blue ("RGB") emitters, or, alternatively, by combined emissions of a blue light emitting diode ("LED") and a yellow phosphor. In the latter case, a portion of the blue LED emissions pass through the phosphor, while another portion of the blue LED emissions is "downconverted" to yellow; the combination of blue and yellow light provide a white light. Another approach for producing white light is to stimulate phosphors or dyes of multiple colors with a violet or ultraviolet LED source. A solid state lighting device may include, for example, at least one organic or inorganic light emitting diode and/or laser.

Many modern lighting applications require high power solid state emitters to provide a desired level of brightness. High power solid state emitters can draw large currents, thereby generating significant amounts of heat that must be dissipated. Many solid state lighting systems utilize heatsinks in thermal communication with the heat-generating solid state light sources. For heatsinks of substantial size and/or subject to exposure to a surrounding environment, aluminum is commonly employed as a heatsink material, owing to its reasonable cost, corrosion resistance, and relative ease of fabrication. Aluminum heatsinks for solid state lighting devices are routinely formed in various shapes by casting, extrusion, and/or machining techniques. Leadframe-based solid state emitter packages also utilize chip-scale heatsinks, with such heatsinks and/or leadframes being fabricated by techniques including stamping (e.g., U.S. Pat. No. 7,224,047 to Carberry, et al.); with such chip-scale heatsinks typically being arranged along a single non-emitting (e.g., lower) package surface to promote thermal conduction to a surface on which the package is mounted. Such chip-scale heatsinks are generally used as intermediate heat spreaders to conduct heat to other device-scale heat dissipation structures, such as cast or machined heatsinks.

Despite the existence of various solid state lighting devices with heatsinks, improvements in heatsinks are still required, for example, to serve the following purposes: (1) to provide enhanced thermal performance; (2) to reduce material requirements; (3) to simplify manufacture of high-power and self-ballasted) lighting devices, and/or (4) to enable production of various desirable shapes to accommodate solid state lighting devices adapted to different end use applications.

SUMMARY OF THE INVENTION

The present invention relates to stamped and shaped heatsinks for solid state lighting devices, solid state lighting devices comprising such heatsinks, methods of fabricating such devices, and illumination methods comprising such devices.

In one aspect, the invention relates to a solid state lighting device comprising: a solid state emitter adapted to generate a steady state thermal load upon application of an operating current and voltage to the solid state emitter; and a heatsink stamped from a sheet of thermally conductive material defining a base portion and a plurality of segments projecting outward from the base portion, wherein the heatsink is mounted in thermal communication with the solid state emitter, and the heatsink is adapted to dissipate substantially all of the steady state thermal load to an ambient air environment.

In another aspect, the invention relates to a solid state lighting device comprising: at least one solid state emitter; and a stamped heatsink in thermal communication with the at least one solid state emitter, wherein the heatsink has a base portion and at least one sidewall portion projecting outward from the base portion, with the at least one sidewall portion extending in a direction non-parallel to a plane definable through a surface of the base portion.

In another aspect, the invention relates to a solid state lighting device comprising: at least one chip-scale solid state emitter; and a device-scale heatsink stamped from a sheet of thermally conductive material defining a base portion and a plurality of segments projecting outward from the base portion, the device-scale heatsink being in thermal communication with the at least one chip-scale solid state emitter.

In another aspect, the invention relates to a solid state lighting device comprising a solid state emitter; an electrical connection structure comprising at least one of a screw base connector, an electrical plug connector, and at least one terminal adapted to compressively retain an electrical conductor or current source element; and a heatsink stamped from a sheet of thermally conductive material defining a base portion and a plurality of segments projecting outward from the base portion, the heatsink having a width; wherein the heatsink is characterized by at least one of the following features (a) to (c): (a) the width of the heatsink is at least about ten times a width of the solid state emitter; (b) the width of the heatsink is at least about half the width of the solid state lighting device; and (c) the heatsink is devoid of any portion that is encased in any molded encasing material.

In another aspect, the invention relates to a stamped heatsink adapted for use with a solid state lighting device including at least one solid state emitter, the heatsink comprising a base portion and a plurality of segments projecting outward from the base portion, wherein the solid state emitter adapted to generate a steady state thermal load upon application of an operating current and voltage to the solid state emitter, and the heatsink is adapted to dissipate substantially all of the steady state thermal load to an ambient air environment.

In another aspect, the invention relates to a heatsink adapted for use with a solid state lighting device, the heatsink comprising: a base portion arranged to receive heat from at least one solid state emitter; at least one projecting segment extending outward from the base portion; a dielectric material deposited on the base portion; and at least one electrically conductive trace deposited on the dielectric material; wherein the base portion and the at least one projecting segment are formed from a metallic sheet by a process including at least one of stamping and progressive die shaping.

In another aspect, the invention relates to a method comprising: depositing a first layer of dielectric material over at least a portion of a substantially planar metallic sheet, and depositing a second layer of least one electrically conductive trace over the first layer, to form a composite sheet; and processing the composite sheet with at least one of stamping and progressive die shaping to form a heatsink including (a) a base portion arranged to receive heat from at least one solid state emitter, and (b) at least one projecting segment extending outward from the base portion.

Yet another aspect of the invention relates to a heatsink adapted for use with a solid state lighting device, the heatsink comprising: a base portion arranged to receive heat from at least one solid state emitter; at least one projecting segment extending outward from the base portion; a dielectric material deposited on the base portion; and at least one electrically conductive trace deposited on the dielectric material; wherein the base portion and the at least one projecting segment are formed from a metallic sheet by a process including at least one of stamping and progressive die shaping.

Still another aspect of the invention relates to a solid state lighting device comprising: at least one solid state emitter; a heatsink stamped from a sheet of thermally conductive material defining a base portion and a plurality of segments projecting outward from the base portion, wherein each segment comprises at least one bend; and at least one of a reflector and a lens arranged to receive light from the solid state emitter; wherein at least some segments of the plurality of segments are arranged to structurally support the reflector and/or the lens.

Further aspects of the invention relate to fabrication and utilization of heatsinks and lighting devices, including methods for illumination of objects and/or spaces, as disclosed herein.

In another aspect, any of the foregoing aspects may be combined for additional advantage.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
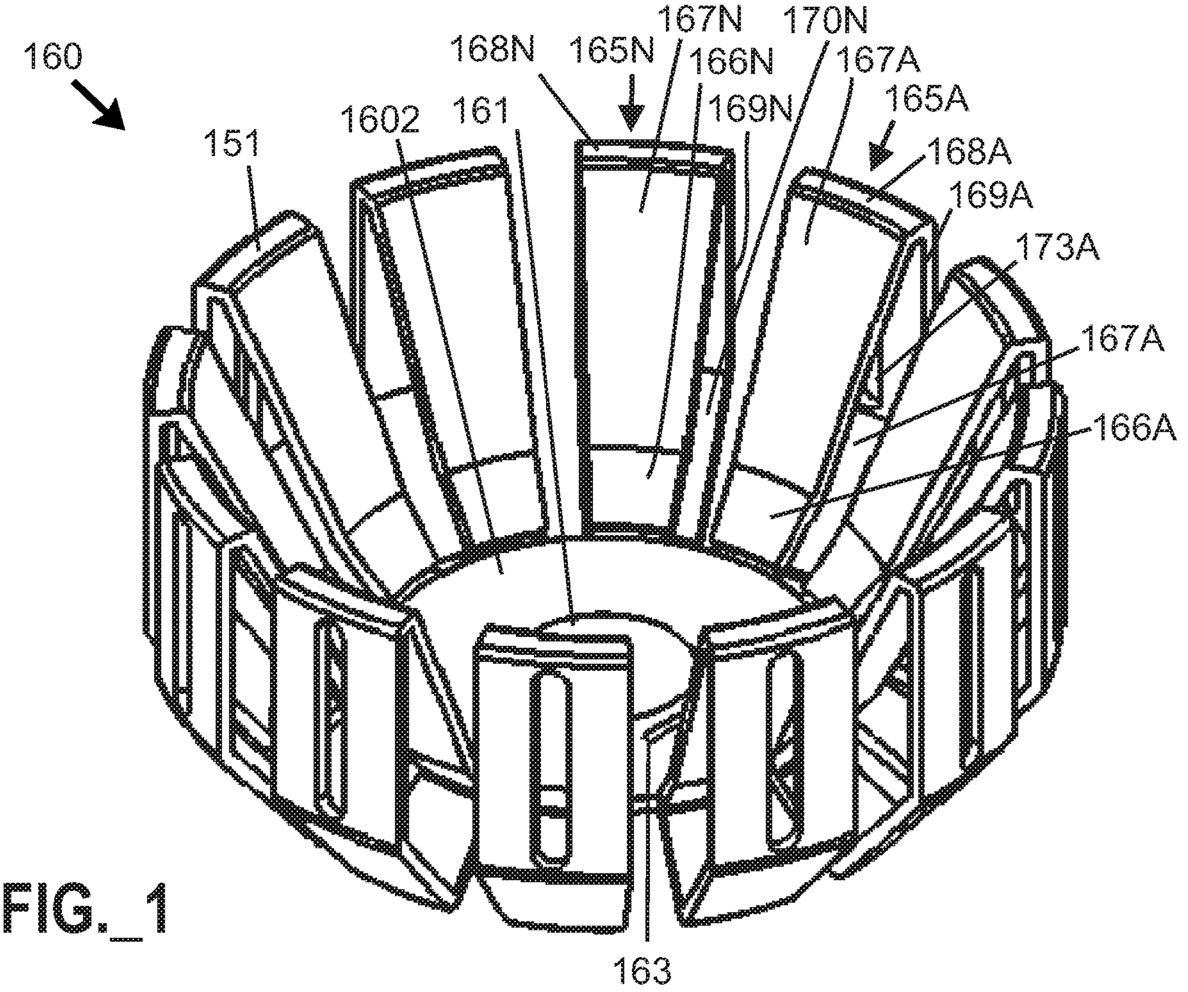
FIG. 1 is a first upper perspective view of a heatsink for a reflector-containing solid state lighting device according to one embodiment of the present invention.
Figure 2:
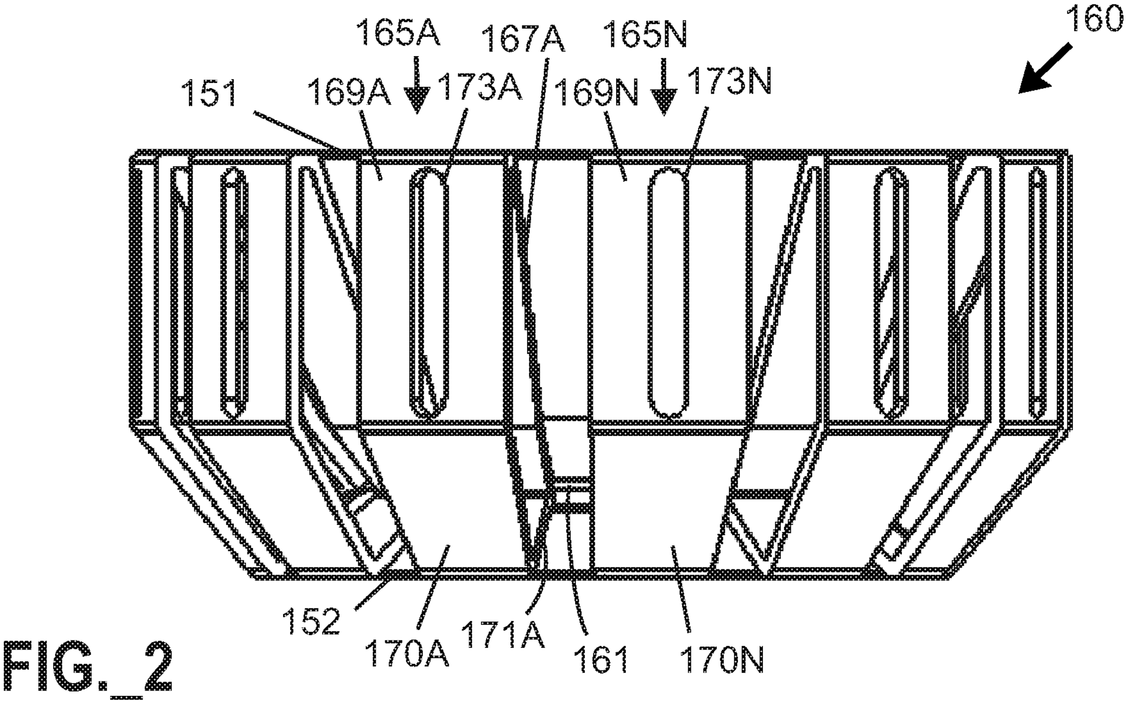
FIG. 2 is a side elevation view of the heatsink of FIG. 1.
Figure 4:
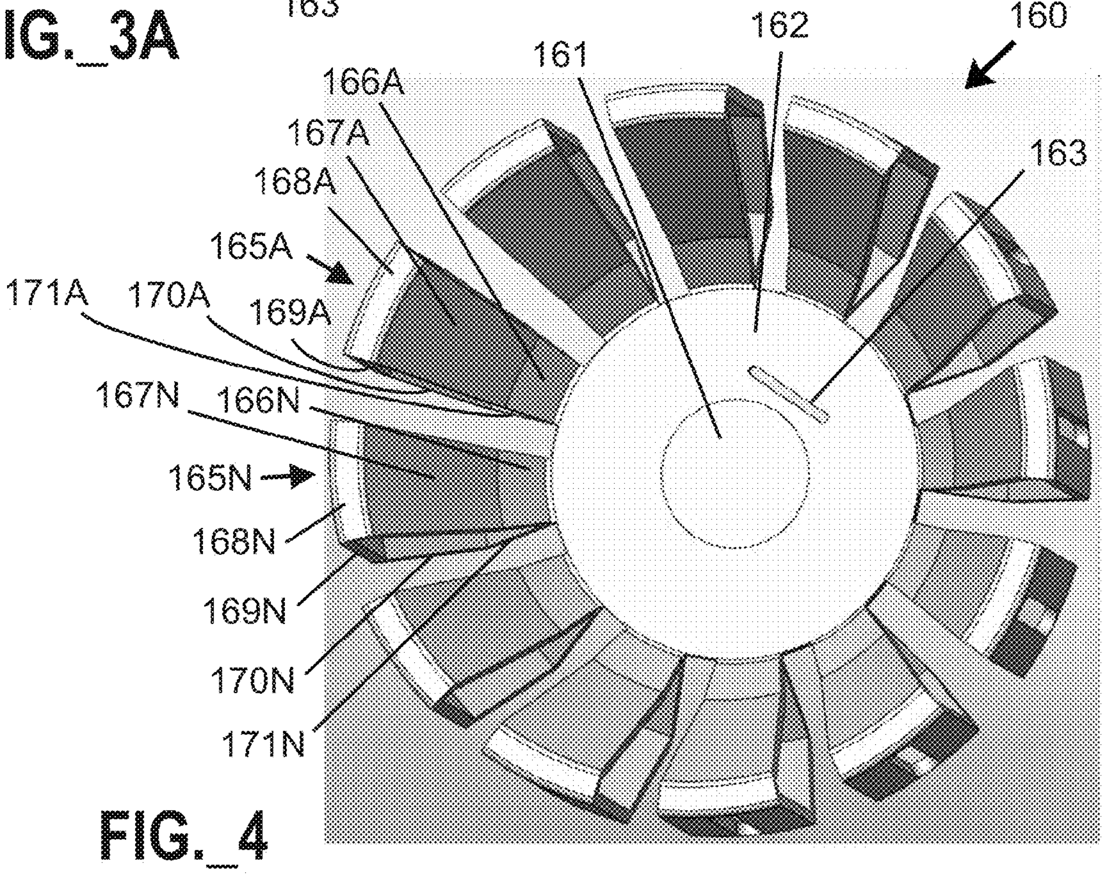
FIG. 4 is a second upper perspective view of the heatsink of FIGS. 1-3.

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude presence of one or more elements.

As used herein, the terms "solid state light emitter" or "solid state light emitting device" may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid state light emitter generates a steady state thermal load upon application of an operating current and voltage to the solid state emitter. Such steady state thermal load and operating current and voltage are understood to correspond to operation of the solid state emitter at a level that maximizes emissive output at an appropriately long operating life (preferably at least about 5000 hours, more preferably at least about 10,000 hours, more preferably still at least about 20,000 hours).

Solid state light emitting devices according to embodiments of the invention may include III-V nitride (e.g., gallium nitride) based LEDs or lasers fabricated on a silicon carbide substrate such as those devices manufactured and sold by Cree, Inc. of Durham, N.C. Such LEDs and/or lasers may be configured to operate such that light emission occurs through the substrate in a so-called "flip chip" orientation.

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials, may be included in such encapsulants.

The term "chip-scale solid state emitter" as used herein refers to an element selected from (a) a bare solid state emitter chip, (b) a combination of a solid state emitter chip and an encapsulant, or (c) a leadframe-based solid state emitter chip package, with the element having a maximum major dimension (e.g., height, width, diameter) of about 2.5 cm or less, more preferably about 1.25 cm or less.

The term "device-scale heatsink" as used herein refers to a heatsink suitable for dissipating heat substantially all of the steady state thermal load from at least one chip-scale solid state emitter to an ambient environment, with a device-scale heatsink having a minimum major dimension (e.g., height, width, diameter) of about 5 cm or greater, more preferably about 10 cm or greater.

The term "chip-scale heatsink" as used herein refers to a heatsink that is smaller than and/or has less thermal dissipation capability than a device-scale heatsink.

The present invention relates in various aspects to device-scale stamped heatsinks for one or more solid state emitters, and lighting devices comprising such heatsinks, including heatsinks adapted to dissipate substantially all of the steady state thermal load of one or more solid state emitters to an ambient environment (e.g., an ambient air environment). Such heatsinks may be sized and shaped to dissipate significant steady state thermal loads (preferably at least about 4 watts, and more preferably at least about 10 watts) to an ambient air environment, without causing excess solid state emitter junction temperatures that would detrimentally shorten service life of such emitter(s). For example, operation of a solid state emitter at a junction temperature of 85° C. may provide an average solid state emitter life of 50,000 hours, while temperatures of 95° C., 105° C., 115° C., and 125° C. may result in average service life durations of 25,000 hours, 12,000 hours, 6,000 hours, and 3,000 hours, respectively. In one embodiment, a device-scale stamped heatsink is adapted to dissipate a steady state thermal load at least about 2 Watts (more preferably at least about 4 Watts, still more preferably at least about 10 watts) in an ambient air environment of about 35° C. while maintaining a junction temperature of the solid state emitter at or below about 95° C. (more preferably at or below about 85° C.). The term "junction temperature" in this context refers to an electrical junction disposed on a solid state emitter chip, such as a wirebond or other contact. Thickness, size, shape, and exposed area of a stamped heatsink as disclosed herein may be adjusted to provide desired thermal performance.

A device-scale may be stamped from a sheet of thermally conductive material (e.g., metal such as (but not limited to) aluminum or aluminum alloy) to define a base portion and a plurality of segments projecting outward from the base portion. One or more solid state emitters may be mounted on or over the base portion. The stamped heatsink may be subject to one or more bending steps (e.g., via progressive die shaping) to add one or more bends to the projecting segments. At least a portion of each segment extends in a direction that is non-parallel to a plane definable through a surface of the base portion. The resulting segments may constitute sidewalls (e.g., spatially separated wall portions) that in combination with the base portion define a cup-like shape that may contain a reflector arranged to reflect light emitted by at least one solid state emitter. At least one bent segment may be used to structurally support a lens and/or reflector associated with a solid state lighting device. Such segment(s) may directly contact the lens and/or reflector, or may support the lens and/or reflector with one or more intervening materials.

As mentioned previously, solid state lighting devices commonly employ device-scale cast, extruded, and/or machined aluminum heatsinks along one or more exposed outer surfaces of such devices. Stamped chip-scale heatsinks have also been used along lower surfaces of leadframe-based solid state emitter packages. Although casting, extrusion, and machining methods have heretofore been used successfully to produce various device-scale heatsinks for solid state lighting devices, and stamping methods have been used to produce chip-scale heatsinks along lower surfaces of leadframe-based packages, the recent introduction of high power solid state devices and imposition of packaging constraints caused Applicants to investigate alternative device-scale heatsink designs and fabrication techniques.

Applicants have discovered that stamping and bending (e.g., progressive die shaping) may be used to fabricate device-scale heatsinks for reflector-containing solid state light emitting devices, and with such heatsinks not being limited in shape or extent to heatsinks disposed immediately adjacent to emitters (such as in conventional leadframe-based solid state emitter packages). Instead, a device-scale heatsink may be formed via stamping and bending to extend well beyond the lateral extent of a reflector that is substantially larger than, and distinct from, a reflector typically integrated into a leadframe-based emitter package. Such heatsink preferably includes a base portion and one or more sidewall portion(s) projecting outward from the base portion, with the sidewall portion(s) extending in a direction non-parallel to a plane definable through a surface of the base portion, such that the base portion and sidewall portion(s) form a cup-like shape adapted to receive at least a portion of a reflector arranged to reflect light emitted by one or more solid state emitters.

In one embodiment, a device-scale heatsink has a width that is at least about ten times (and at least about fifteen times, or at least about twenty times in certain embodiments) the width of a solid state emitter in thermal communication with the device-scale heatsink. The width of the heatsink may be at least about half (or at least about 65%, at least about 75%, or at least about 90% in selected embodiments) the width of a solid state lighting device, with the solid state lighting device including an electrical connection structure comprising at least one of a screw base connector, an electrical plug connector, and at least one terminal adapted to compressively retain an electrical conductor or current source element—noting that the foregoing features distinguish a conventional leadframe-based emitter package, which is a chip-scale device that is typically soldered to underlying contact pads or other surface. As opposed to a leadframe-based emitter package having a chip-scale stamped heatsink with at least a portion thereof encased in a molded encasing material, a device-scale heatsink according to one embodiment is devoid of any portion that is encased in any molded encasing material.

At least one projecting segment of a stamped heatsink may constitute at least one sidewall portion of a device-scale heatsink. The sidewall portion(s) may include a substantially continuous single sidewall, or multiple connected sidewalls, or (more preferably) multiple spatially segregated sidewall portions or segments. Such sidewall portions may advantageously embody a plurality of spatially segregated projecting segments extending outward from a central base portion of the heatsink and extending beyond a peripheral edge of the reflector. Multiple spatially segregated segments of sidewall portions may radiate outward from a central base portion. Any suitable number of sidewall portions or segments thereof may be employed. In one embodiment, the number of sidewall portions or segments provided in a heatsink according to the present invention includes at least four, more preferably at least six, more preferably at least eight, more preferably at least ten, and more preferably at least twelve. An even or odd number of sidewall portions or segments may be provided. Projecting segments or sidewalls may be of equal or unequal sizes, and may be symmetrically or asymmetrically arranged depending upon design and operating criteria of a resulting solid state lighting device.

In one embodiment, the projecting segment(s) or sidewall portion(s) are arranged to contact a reflector and/or a lens disposed over the reflector. Such arrangement may lend structural support to the reflector and/or lens, and ease design and assembly of a lighting device through use of the heatsink as a structural support component.

The heatsink preferably includes a bend, or more preferably, multiple bends, to provide increased surface area (thereby aiding heat dissipation) within a limited volume. Progressive die shaping or any other suitable method may be used to form such bends. Such bends may cause sidewall portions of a heatsink to extend in a direction non-coplanar with (i.e., non-parallel to a plane definable through) a base portion of the heatsink (e.g., upward) to form a cup-like inner wall portion adapted to receive at least a portion of a reflector), and then to change direction (e.g., downward) to form an outer wall portion partially or fully circumscribing the inner wall portion. A gap may be maintained between the inner wall and outer wall portions to permit air circulation therebetween. One or more apertures may be defined in the sidewall portions, and the sidewall portions may include multiple spatially separated projecting segments, to facilitate air circulation and/or provide increased surface area, thereby aiding in dissipation of heat.

Sidewall portions of a heatsink according to the present invention may be bent into multiple sections that are angular or curved in cross-section. Bends may be formed using mechanical and/or hydraulic rams or presses, or other conventional bending apparatuses, optionally aided by use of forms or stops to promote attainment of desired shapes.

Heatsinks according to the present invention may be fabricated of suitably thermally conductive and ductile materials, including metals such as aluminum, copper, silver, and the like. Aluminum and alloys thereof are particularly desirably due to reasonable cost and corrosion resistance.

A heatsink 160 according to one embodiment of the present invention is illustrated in FIGS. 1-4. The heatsink 160 has a first end 151 and a second end 152, and includes a central base portion 162 having a mounting region 161 arranged to receive at least one solid state emitter, or a submount associated with at least one solid state emitter. Numerous sidewall portions or segments 165A-165N radiate and extend outward from the base portion 162. (Element numbers for each individual sidewall portion or segment have been omitted from the Figures to promote clarity. Although twelve sidewall portions or segments are shown in various figures, it is to be understood that any desirable number of sidewall portions or segments may be provided, with the letter "N" representing a variable indicative of a desired number; this nomenclature is used hereinafter.).

As illustrated in FIGS. 1-4, each sidewall portion or segment 165A-165N includes multiple bends, resulting in formation of first and second angled portions 166A-166N, 167A-167N, respectively, that in combination constitute an inner wall. The first and second angled portions 166A-166N, 167A-167N, in combination with the base portion 162, form a cup-like shape arranged to receive at least a portion (or the entirety) of a reflector (e.g., secondary reflector 124 shown in FIGS. 7-8). At ends distal from the first angled portions 166A-166N, the second angled portions 167A-167N are bent to form third apex portions 168A-168N corresponding to the first end 151 of the reflector. From the third apex portions 168A-168N, each sidewall portion or segment 165A-165N is bent in a recurved manner, to form fourth angled portions 169A-169N which further define apertures 173A-173N therein. Fifth angled portions 170A-170N extend from the fourth angled portions 169A-169N, and sixth angled portions 171A-171N extend from the fifth angled portions 171A-171N. The fourth, fifth, and sixth angled portions 169A-169N, 170A-170N, 171A-171N in combination constitute an outer wall that surrounds the inner wall constituted by the first and second angled portions 166A-166N, 167A-167N. A lateral gap is defined between each adjacent sidewall portion or segment 165A-165N, and a radial gap is defined between the inner wall and outer wall. Such lateral and radial gaps, together with the apertures 173A-173N, facilitate air circulation and/or provide increased surface area, thereby aiding in dissipation of heat in use of the heatsink 160.

Figure 3A:
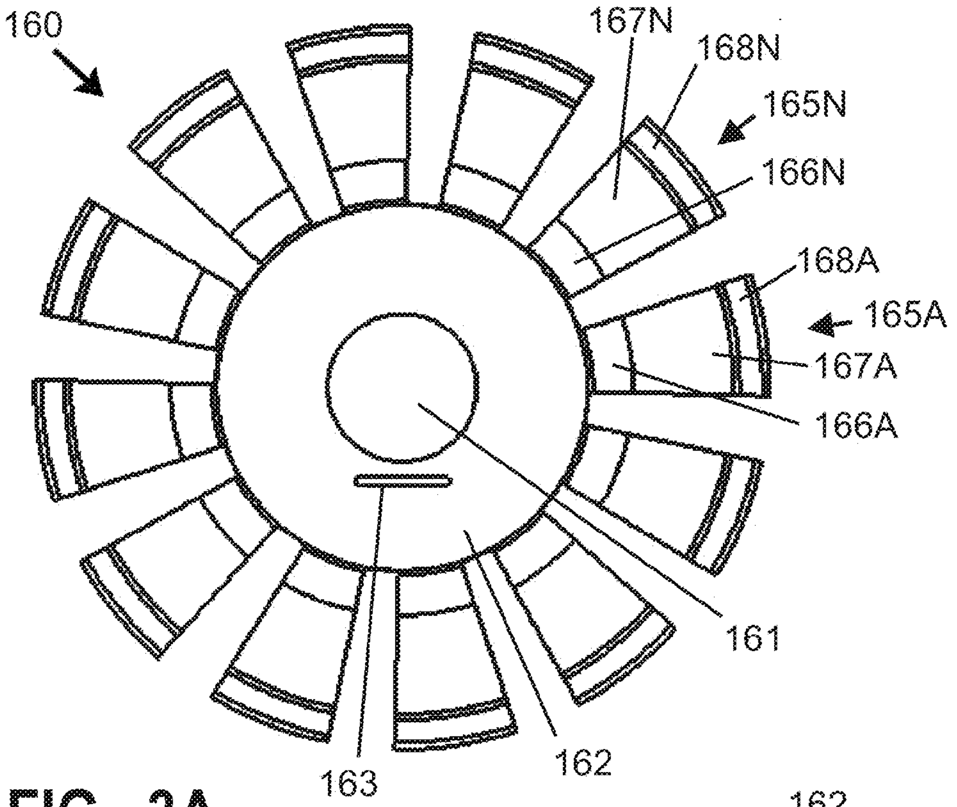
FIG. 3A is a top plan view of the heatsink of FIGS. 1-2.
Figure 3B:
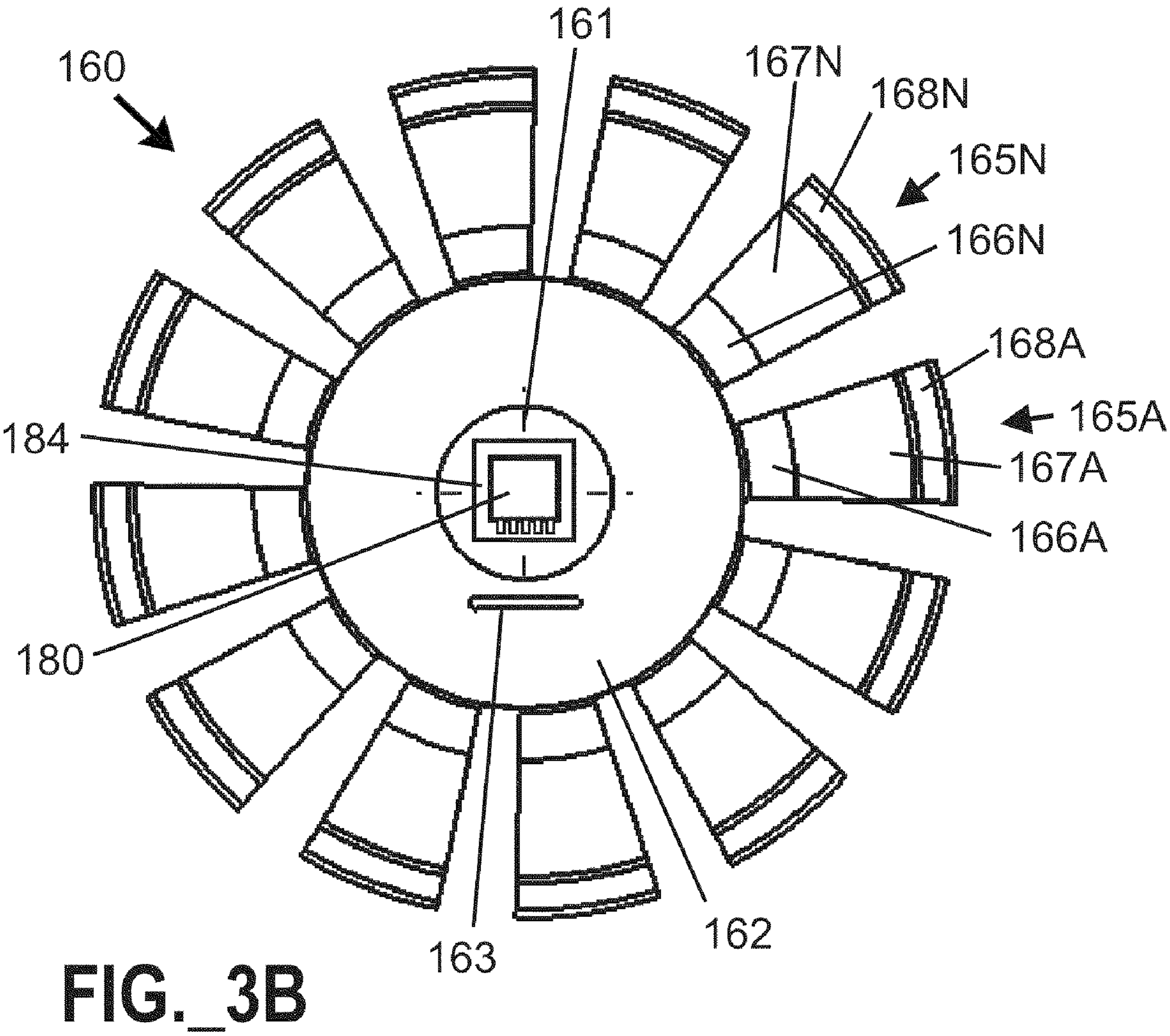
FIG. 3B is a top plan view of the heatsink of FIGS. 1, 2, and 3A, with a chip-scale heatsink or heat spreader and solid state emitter chip arranged thereon.
Figure 6:
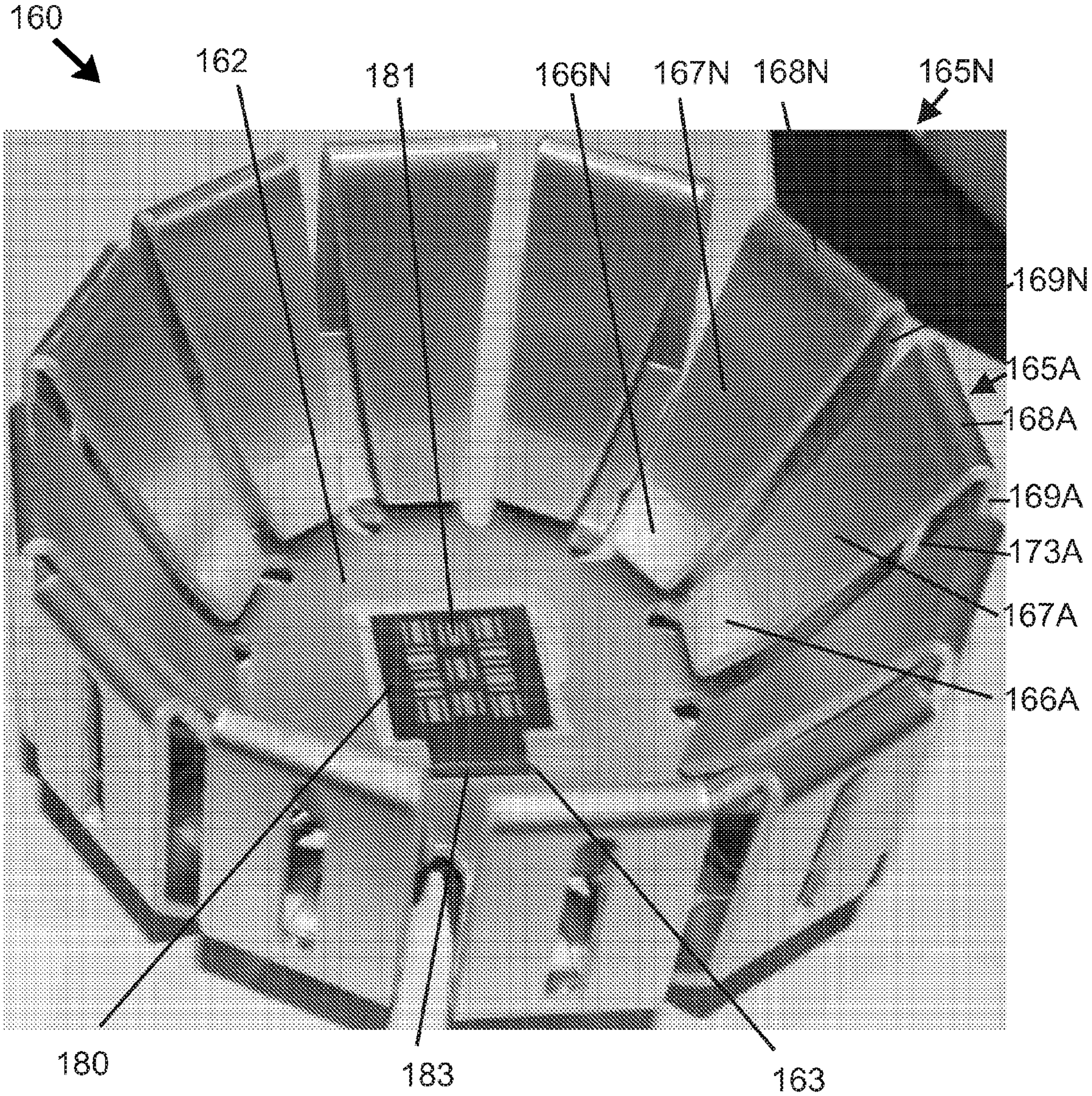
FIG. 6 is an upper perspective view of the heatsink of FIGS. 1-4 containing a submount arranged for receiving multiple solid state emitters.
Figure 7:
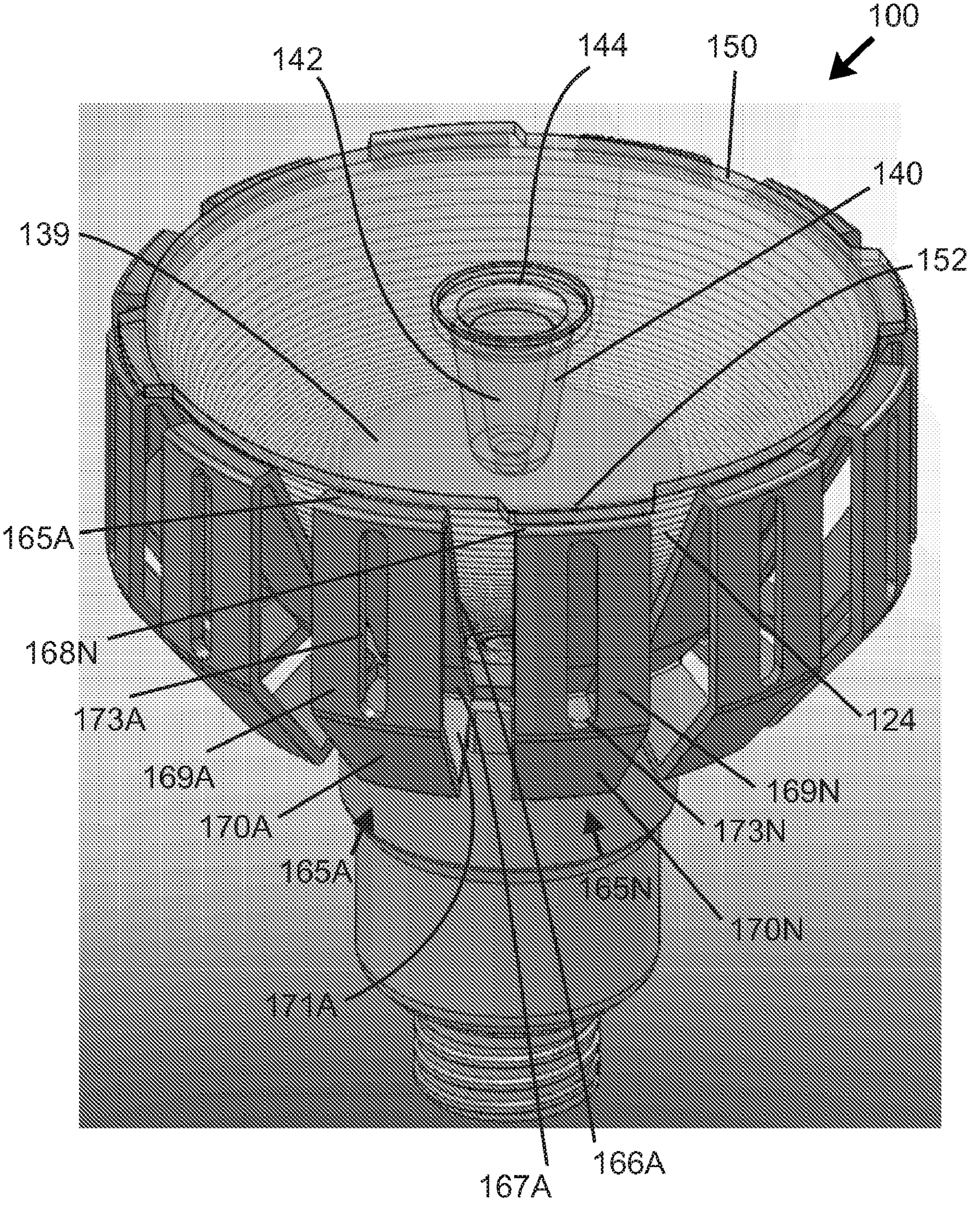
FIG. 7 is an upper perspective view of a first portion of a solid state lighting device comprising the heatsink of FIGS. 1-4 and FIG. 6, according to one embodiment of the present invention.
Figure 8:
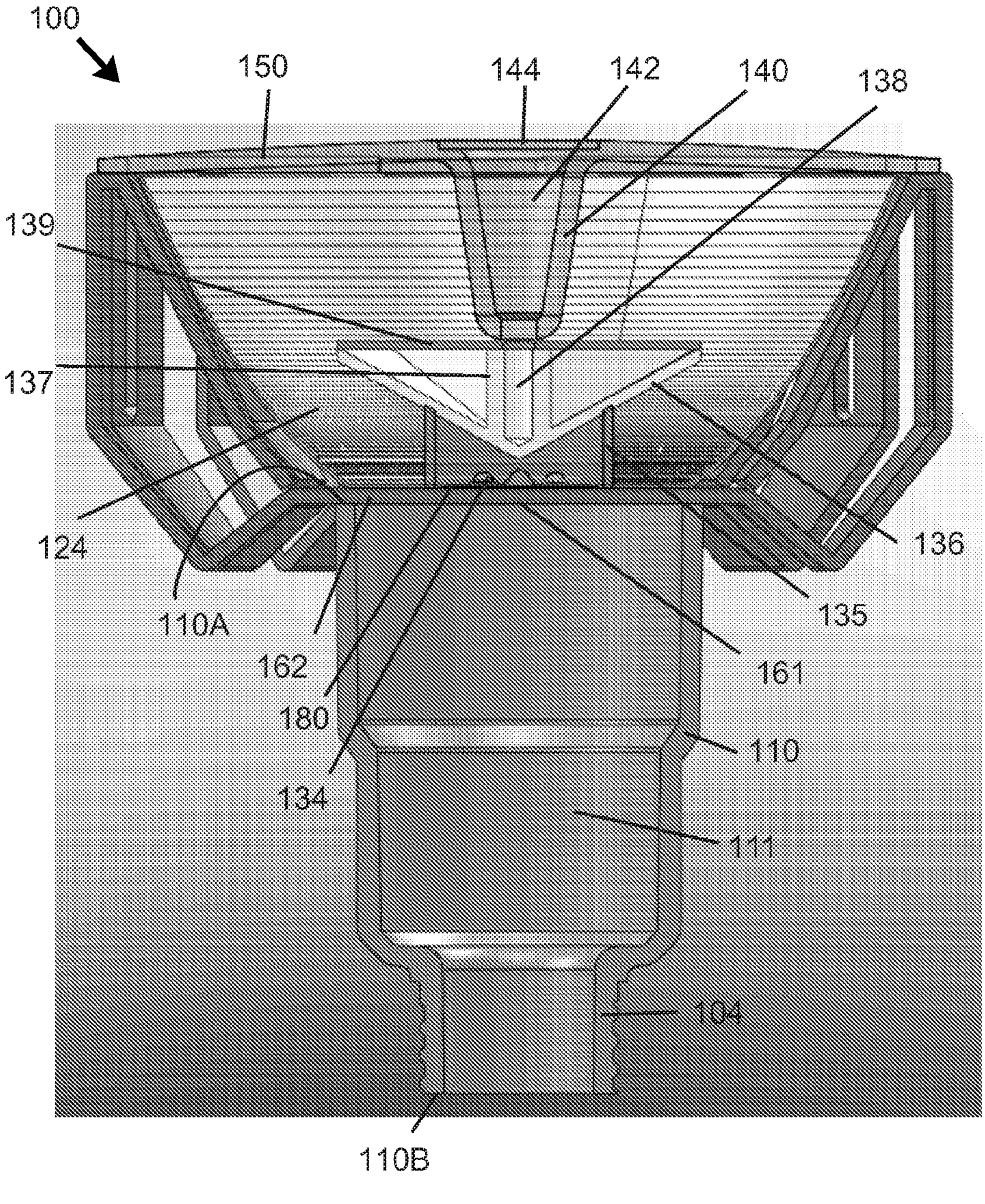
FIG. 8 is a side cross-sectional view of the first portion of the solid state lighting device of FIG. 7.
Figure 9:
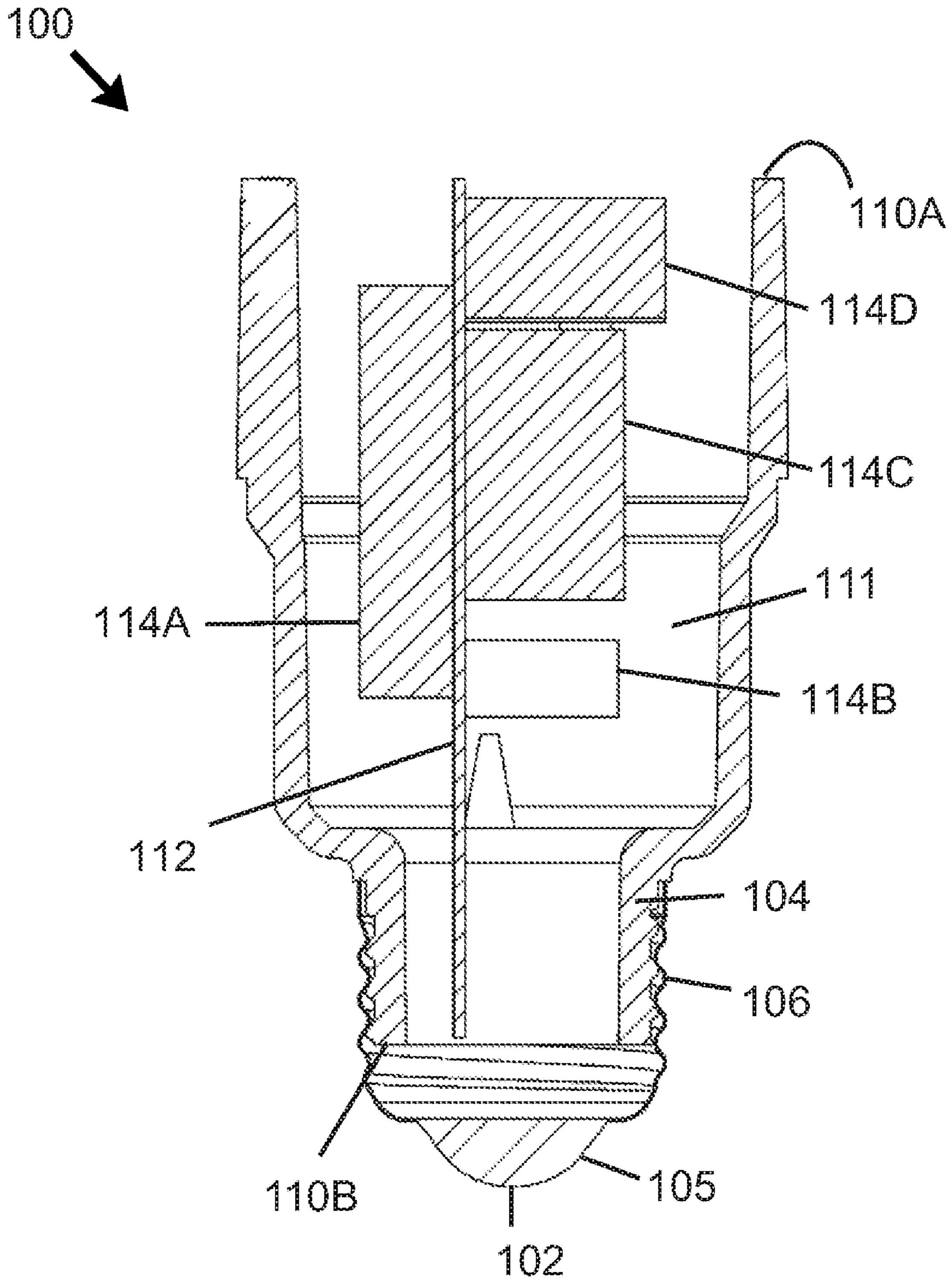
FIG. 9 is a side cross-sectional view of a second portion of a solid state lighting device, such as the device of FIGS. 7-8.

The base portion 162 of the heatsink 160 defines an aperture 163, which may be configured as a slot. The aperture 163 may be arranged to receive at least one electrical conductor 183 operatively connected to at least one solid state emitter. As shown in FIG. 3B, a chip-scale heatsink or heat spreader 184 is disposed between a solid state emitter chip 180 and the device-scale stamped heatsink 160. In one embodiment, a flexible printed circuit board portion and/or bundle of wires may be inserted through aperture 163 to provide at least one (preferably multiple) electrically conductive path between at least one solid state emitter and an electrical power supply components of a lighting device. Referring to FIG. 6, a pad 180 (preferably comprising a thermally conductive material) may be affixed to the mounting region 161 of the base portion 162 using an electrically insulating but thermally conductive paste or other conventional means, and the pad 180 may include a plurality of electrical traces 181. Use of an electrically insulating paste and/or electrically isolating layer of the pad 180 permits the heatsink 160 to be electrically isolated from any solid state emitter(s) connectable to the electrical traces 181. In an alternative embodiment, the heatsink 160 is utilized as a contact and/or is intentionally electrically active. A flexible tab portion 163 of the pad 180 may be inserted through the aperture 163 to enable electrical connection to power supply components locatable below the base portion 162 (e.g., with a housing 110 of a solid state lighting device 100, as shown in FIGS. 7-9). In lieu of a single aperture 163, multiple apertures may be defined through the base portion 162.

Figure 5:
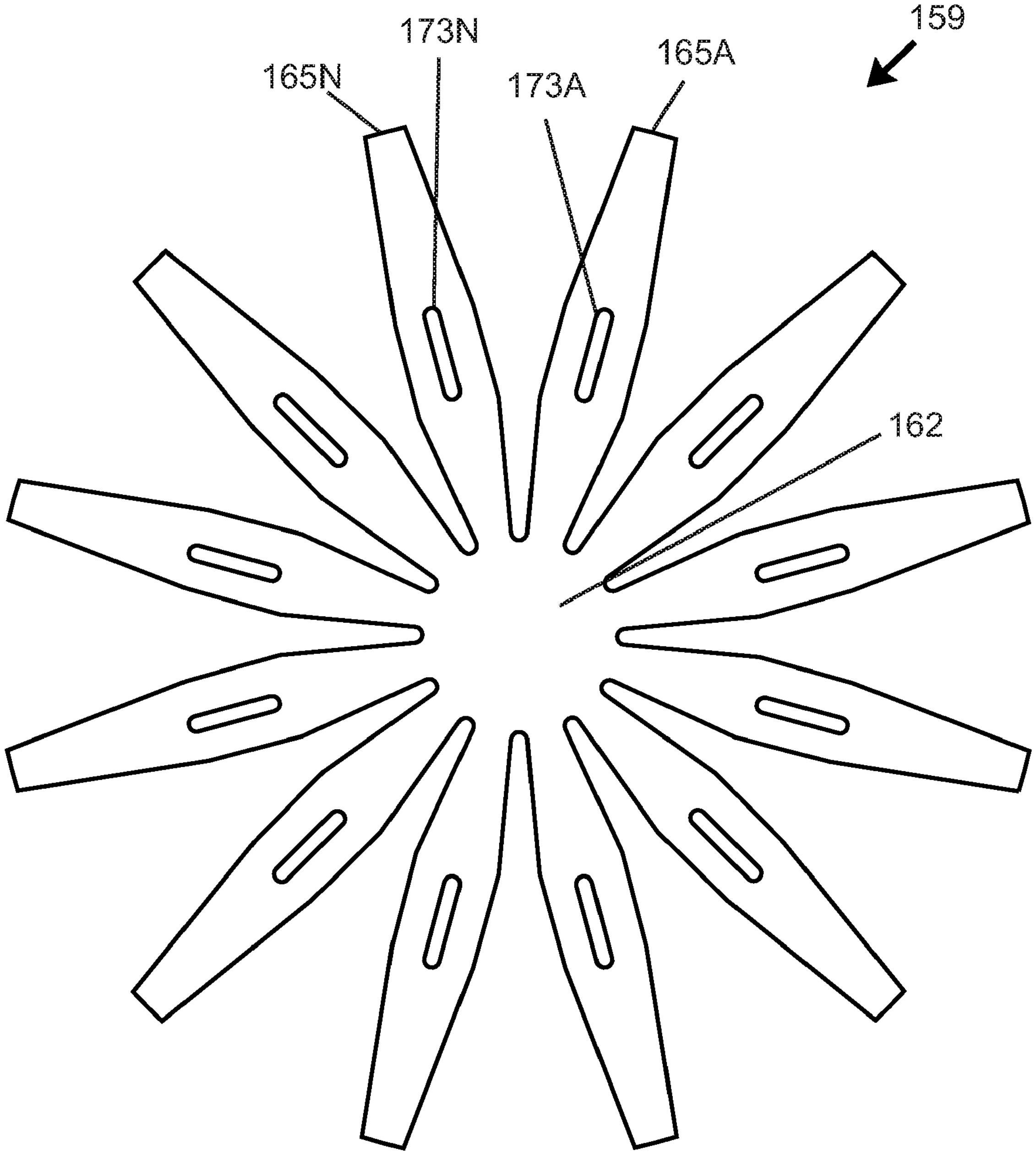
FIG. 5 is a top plan view of a stamped flat blank useable for fabricating the heatsink of FIGS. 1-4.

Referring to FIG. 5, the heatsink 160 may be fabricated by stamping a blank 159 (including central base portion 162 and radially extending segments 165A-165N including apertures 173A-173N) from at least one metal-containing or metallic sheet. In one embodiment, the sheet may comprise a plurality of layers and/or a composite, optionally including a dielectric material (or electrically insulating material) deposited on a thermally conductive bland, and one or more electrically conductive traces disposed on the dielectric material. The resulting composite sheet may be subject to bending or shaping after one or more material deposition steps. In one embodiment, the thickness of the sheet(s) from which the blank 159 is formed is substantially constant. In another embodiment, the thickness of the sheet(s) from which the blank 159 is formed is subject to intentional variation, for example, varying from a thicker region closer to the central base portion 162, to one or more thinner regions closer to the distal ends of the radially extending segments 165A-165N. Such thickness variation may be stepwise or gradual/continuous in nature. Multiple variations in thickness may be provided from the central base portion 162 of the blank 159 to a lateral or radial edge thereof. Variations in thickness may be created by laminating one or more materials of different radial extent to form the blank 159, or by compression forming of the blank 159 using rollers and/or impression dies, preferably followed by a stamping step to define the edges and/or apertures 173A-173N of the blank 159. In one embodiment, an average thickness of the base portion 162 is greater than an average thickness of the segments 165A-165N by a factor of at least about two. After formation of the blank 159, the radially extending segments 165A-165N may be bent or otherwise shaped using any suitable method to yield the heatsink 160 shown in FIGS. 1-4 and FIG. 6.

The heatsink 160 (or another heatsink as disclosed herein) may be incorporated into a solid state light emitting device 100, of which a first portion thereof is illustrated in FIGS. 7-8, and a second portion thereof is illustrated in FIG. 9. At least one surface of the heatsink 160 is arranged along an exterior surface of the lighting device 100, and preferably constitutes a radial boundary of the device 100 along a widest portion thereof. The device 100 includes a housing 110 having a first end 110A and a second end 110B, with a male screw base 104 formed along the second end 110B. Adjacent to the second end 110B of the housing 110, electrical connectors 105, 106 are arranged as a screw-type Edison base with a protruding axial connector 105 and a lateral, threaded connector 106 (formed over the male screw base 104 of the housing 110) arranged for mating with a threaded socket of a compatible fixture (not shown). As an alternative to a screw base, a lighting device may optionally include an electrical plug connector, and/or at least one terminal adapted to compressively retain an electrical conductor or current source element (e.g., a battery). The housing 110 preferably comprises an electrically insulating material, such as an electrically insulating plastic, ceramic, or composite material. Disposed within the housing 110 are a longitudinal printed circuit board 112 (which includes conductors in electrical communication with the connectors 105, 106) and power supply elements 114A-114D mounted thereto. The various power supply elements 114A-114D and circuit board 112 may embody solid state emitter drive control components providing such ballast, color control and/or dimming utilities. The circuit board 112 and/or power supply elements 114A-114D may be in electrical communication with the pad 180 (on which or over which at least one solid state emitter 134 is mounted) by way of electrical traces or conductors associated with the flexible tab portion 163 insertable through the base portion 162 of the heatsink (as illustrated in FIG. 6).

The base portion 162 of the heatsink 160 is disposed adjacent to the first end 110A of the housing 110, with the housing 110 being affixable to the heatsink 160 using any conventional means such as screws, adhesives, mechanical interlocks, and the like. A secondary reflector 124 may also be affixed to the heatsink 160, with the reflector 124 being disposed within the cup-shaped combination of the base portion 162 and sidewall portions or segments 165A-165N (specifically, the first and second angled portions 166A-166N, 167A-167N, respectively). In one embodiment, the secondary reflector 124 may contact or be supported by the first and/or second angled portions 166A-166N, 167A-167N. Disposed over a cavity defined by the reflector is a lens 150 including tab portions 152 extending over the second end 152 of the heatsink 160 in contact with at least some of the third angled portions 168A-168N thereof.

Disposed within a cavity formed by the secondary reflector 124, and adjacent to (e.g., over) the central mounting region 161 of the base portion 162, are one or more solid state emitters 134, optionally mounted over a pad 180.

Additionally disposed within the cavity formed by the secondary reflector 124, and supported by at least one tube or support element 135 (which may constitute an aggressive diffuser with diffusive material dispersed throughout, or coated on an inside and/or outside surface thereof), is a primary reflector 139 having a reflective surface, a transmissive surface 136, and central support or guide tube 137 defining an aperture 138. Each of the primary reflector 139 and the secondary reflector 124 is preferably formed of a suitably reflective material, such as polished metal, or a metal coating over a non-metallic material. The primary reflector 139 and the secondary reflector 124 are preferably provided in a double bounce arrangement. Additional details regarding double bounce reflector designs are disclosed in U.S. patent application Ser. No. 12/418,816 filed on Apr. 6, 2009, subsequently published as U.S. Patent Application Publication No. 2010/0155746, and commonly assigned to the same assignee of the present application, which prior application and publication are hereby incorporated by reference as if set forth fully herein.

The primary reflector 139, which may comprise a specular reflective material (e.g., optionally including faceting) or a diffuse material, is disposed proximate to the one or more (preferably multiple) solid state emitters 134 to reflect light emitted therefrom—e.g., in order to spatially mix such emissions prior to incidence on the secondary reflector 124. The primary reflector 139 may have generally tapered conic shape. The secondary reflector 124 is adapted to shape and direct an output light beam. The secondary reflector 124 may be specular (optionally faceted) or diffuse, and may be parabolic or angular. As light is emitted by the solid state emitter(s) 134, the tube element 135 guides light through the transmissive surface 136 toward the primary reflector 139. The tube element 135 may also include a wavelength conversion material such as a phosphor (e.g., phosphor particles may be dispersed throughout the volume of the tube element, or coated on inside and/or outside surfaces thereof). In this manner, the tube element 135 may function to convert the wavelength of a portion of the emitted light.

A mounting post 112 may extends from the lens 150 and support the primary reflector 135. In one embodiment, the primary reflector 139 fully shields the mounting post 112 from non-reflected emissions of the solid state emitter(s) 134. In another embodiment, a central portion of the primary reflector 139 is devoid of reflective material, such that light may be transmitted through a central portion of the primary reflector 139 into the mounting post 140 and a cavity 142 defined therein, to exit through a central lens portion 144.

In one embodiment, one or more sensors (not shown) may be arranged in or on the primary reflector, in or on the mounting post, or in or on the secondary reflector 124 (or a cavity formed by the secondary reflector 124), to receive emissions from the solid state emitter(s) 134. The sensor(s) may be used to sense one or more characteristics (e.g., intensity, color) of light output by the emitter(s) 134. Multiple sensors, including at least one optical sensor, may be provided. At least one of the power supply elements 114A-114D may be operated responsive to an output signal from the sensor(s). At least one temperature sensor (not shown) may be further provided adjacent to the emitter(s) 134, the heatsink 160, or any other desired component (e.g., the pad 180) to sense an excessive temperature condition, and an output signal of the temperature sensor(s) may be used to responsively limit flow of electrical current to the emitter(s) 134, terminate operation of the solid state lighting device 100, and/or trigger an alarm or other warning.

One or more (preferably multiple) solid state emitters 134 are mounted at the base of the primary reflector 139. In one embodiment, the at least one solid state emitter 134 includes multiple emitters, including light emitting diodes and/or lasers. One or more solid state emitters 134 may be disposed or embodied in a leadframe-based package. Examples of leadframe-based packages are disclosed in U.S. patent application Ser. No. 12/479,318 (entitled "Solid State Lighting Device") published as U.S. Patent Application Publication No. 2010/0133554, and U.S. patent application Ser. No. 12/769,354 (entitled "Lighting Device") published as U.S. Patent Application Publication No. 2010/0270567, which applications and publications are commonly assigned to the same assignee of the present application, and are hereby incorporated by reference as if set forth fully herein. A solid state emitter package may desirably include a common leadframe, and optionally a common submount to which the emitters may be mounted, with the submount being disposed over the leadframe. At least one conductor is desirably formed along a non-emitting surface of such a package. A leadframe-based package may include an integral thermal pad (e.g., heat spreader) arranged to conduct heat away from the emitters. One or more emitters may be arranged to white light or light perceived as white. Emitter of various colors may be provided (e.g., whether as emitters or emitter/lumiphor combinations), optionally in conjunction with one or more white light emitters. At least two emitters of a plurality of emitters may have different dominant emission wavelengths. If multiple emitters are provided, the emitters may be operable as a group or operated independently of one another, with each emitter having an electrically conductive control path that is distinct from the electrically conductive control path for another emitter. In one embodiment, multiple solid state emitters are provided, and each emitter is independently controllable relative to other emitters to vary output color emitted by the lighting device. An encapsulant, optionally including at least one luminescent material (e.g., phosphors, scintillators, lumiphoric inks) and/or filter, may be arranged in or on a package containing the solid state emitter(s).

In operation of the solid state light emitting device 100, electrical current is delivered through the connectors 105, 106 to the longitudinal circuit board 112 and associated components 114A-114D. Conductive traces, wires, and/or other conductors, such as traces 181 provided on a pad 180, may be used to supply current to the solid state emitter(s) 134. Light from the emitter(s) travels through the support or guide tube 137 to impinge on the primary reflector 139, which reflects light emitted from the solid state emitter(s) 134 toward the secondary reflector 124. The secondary reflector 124 (of which at least a portion is received within a cavity defined by the heatsink 160) reflects light through the lens 150 to exit the device 100. Heat from the emitter(s) 134 is conducted laterally from the mounting region 161 through the base portion 162 to the sidewall portions or segments 165A-165N. The heatsink 160 is therefore in thermal communication with the emitter(s) 134, optionally through intermediate components such as a contact pad 180 (as illustrated in FIG. 6) and thermally conducting paste adjacent to such pad 180. The emitter (s) 134 may be further separated from the heatsink 160 via an intermediately disposed submount, leadframe, and/or heat spreader (not shown). Heat received by the heatsink 160 is then dissipated to a surrounding environment (e.g., air within such an environment) proximate to the lighting device through any suitable heat transport mode, such as radiation, convection, or conduction. Optionally, a flow of air or other cooling fluid may be directed against any portion of the heatsink 160 to promote convective cooling. Such flow of fluid may be generated by operating a cooling device (e.g., a fan, a pump, etc.) in thermal communication with the heatsink to cool the heatsink, with such operation optionally being controlled responsive to a thermal sensor or other sensor in sensory communication with the solid state lighting device 100.

Figure 10:
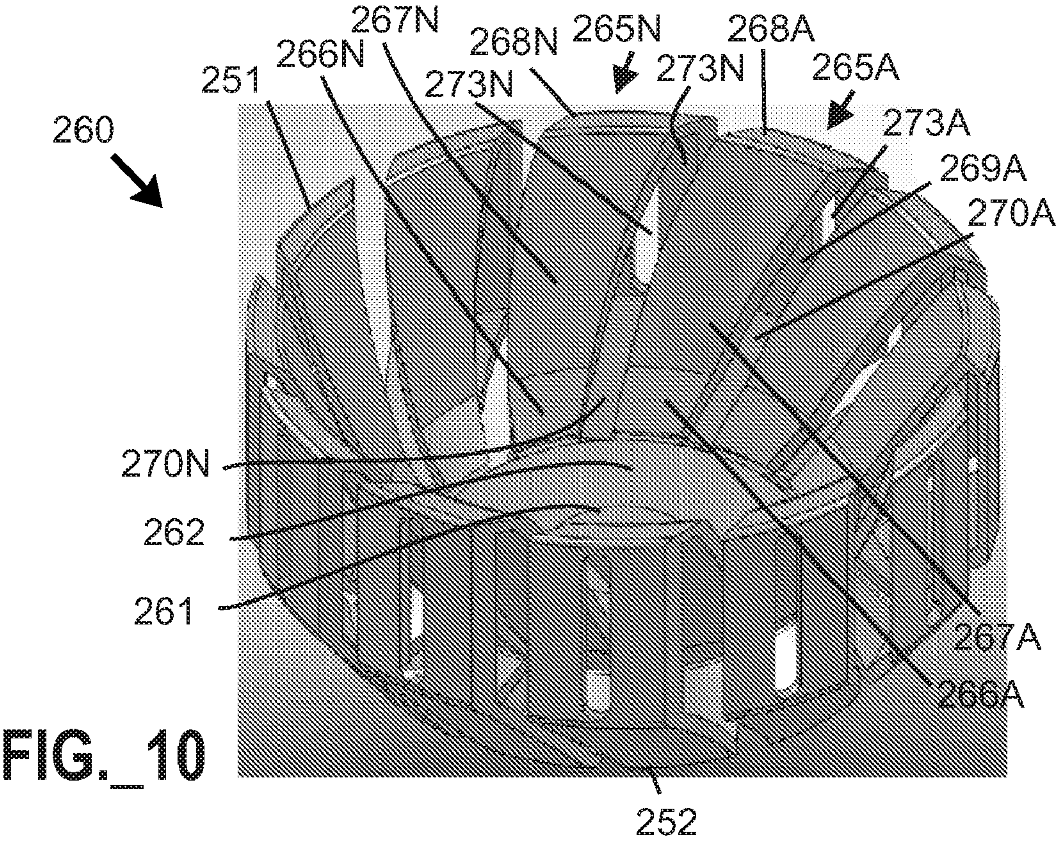
FIG. 10 is an upper perspective view of a first alternative heatsink for a reflector-containing solid state lighting device according to one embodiment of the present invention.
Figure 11:
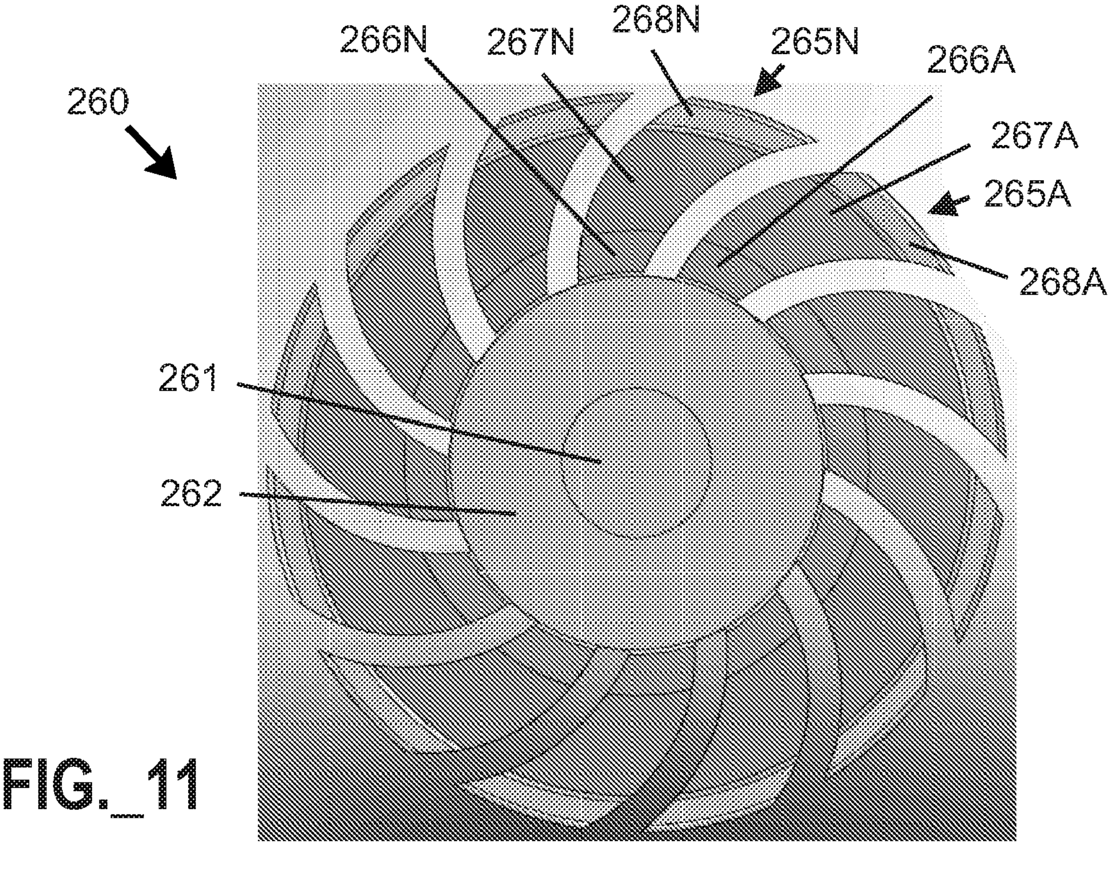
FIG. 11 is a top plan view of the heatsink of FIG. 10.

Heatsinks according to embodiments of the present invention may be provided in shapes and conformations other than the heatsink 160 described previously. Referring to FIGS. 10-11, a heatsink 260 adapted for use with a reflector-containing solid state lighting device includes a first end 251, and second end 252, and numerous sidewall portions or segments 265A-265N that radiate and extend outward from a base portion 262, with the sidewall portions or segments 265A-265N being arranged in a 'swirled' configuration relative to the base portion 262 and mounting pad 261. Each sidewall portion or segment 265A-265N includes multiple bends, resulting in formation of first and second angled portions 266A-266N, 267A-267N, respectively, that in combination constitute an inner wall. The first and second angled portions 266A-266N, 267A-267N, in combination with the base portion 262, form a cup-like shape arranged to receive at least a portion (or the entirety) of a reflector. At ends distal from the first angled portions 266A-266N, the second angled portions 267A-267N are bent to form third apex portions 268A-268N corresponding to the first end 251 of the reflector. From the third apex portions 268A-268N, each sidewall portion or segment 265A-265N is bent in a recurved manner, to form fourth angled portions 269A-269N which further define apertures 273A-273N therein. Fifth angled portions 270A-270N extend from the fourth angled portions 269A-269N, and sixth angled portions 271A-271N extend from the fifth angled portions 271A-271N. The fourth, fifth, and sixth angled portions 269A-269N, 270A-270N, 271A-271N in combination constitute an outer wall that surrounds the inner wall constituted by the first and second angled portions 266A-266N, 267A-267N.

Figure 12:
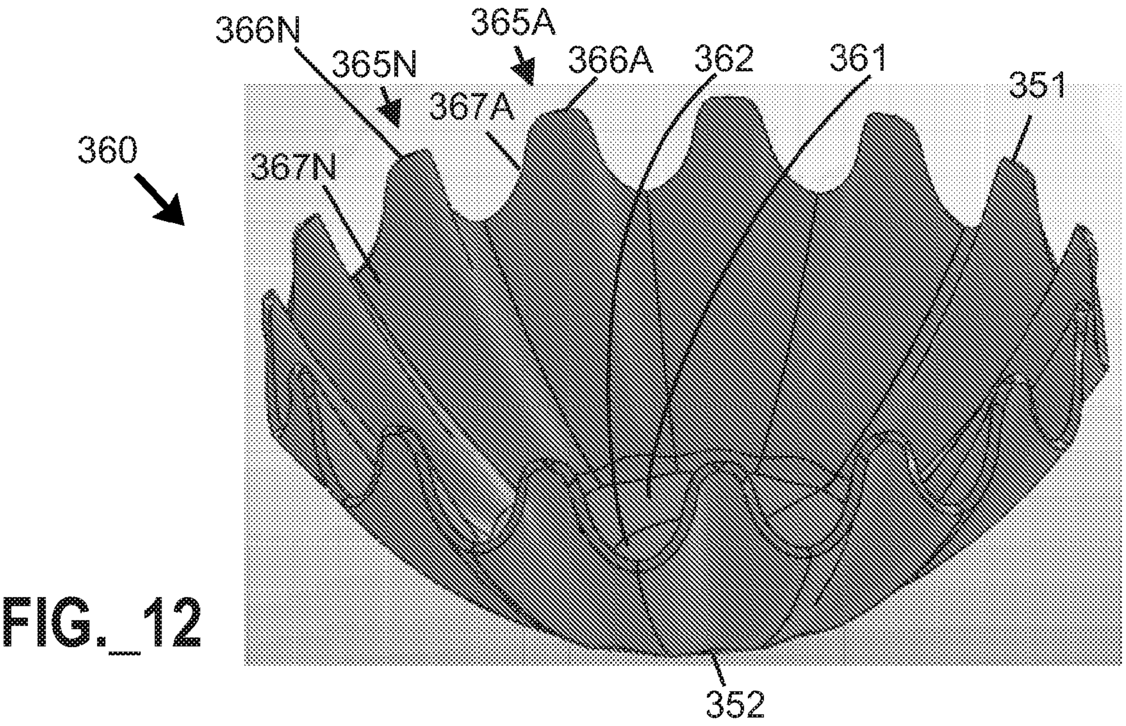
FIG. 12 is an upper perspective view of a second alternative heatsink for a reflector-containing solid state lighting device according to one embodiment of the present invention.

FIG. 12 illustrates a heatsink 360 adapted for use with a reflector-containing solid state lighting device, according to another embodiment. The heatsink 360 includes a first end 351 and a second end 352, with a base portion 362 having an emitter mounting region 362 disposed adjacent to the second end 352. The heatsink 360 includes a sidewall composed of multiple interconnected sidewall portions 365A-365N each having an elevated and inwardly-protruding wall portion 366A-366N, and an outwardly protruding wall portion 367A-367N disposed between each elevated and inwardly-protruding wall portion 366A-366N. The sidewall portions 365A-365N, 366A-366N in combination with the base portion 362 define a cavity adapted to receive at least a portion of a reflector of a solid state lighting device. The heatsink 360 may be formed by stamping a blank from a sheet of metal, and then shaping the blank to form the inwardly-protruding wall portions 366A-366N and an outwardly protruding wall portions 367A-367N. As compared to the heatsink 160 according to the first embodiment, the heatsink 360 exhibits diminished heat transfer capability, ostensibly due to reduced surface area and lack of openings to facilitate air circulation.

Figure 13:
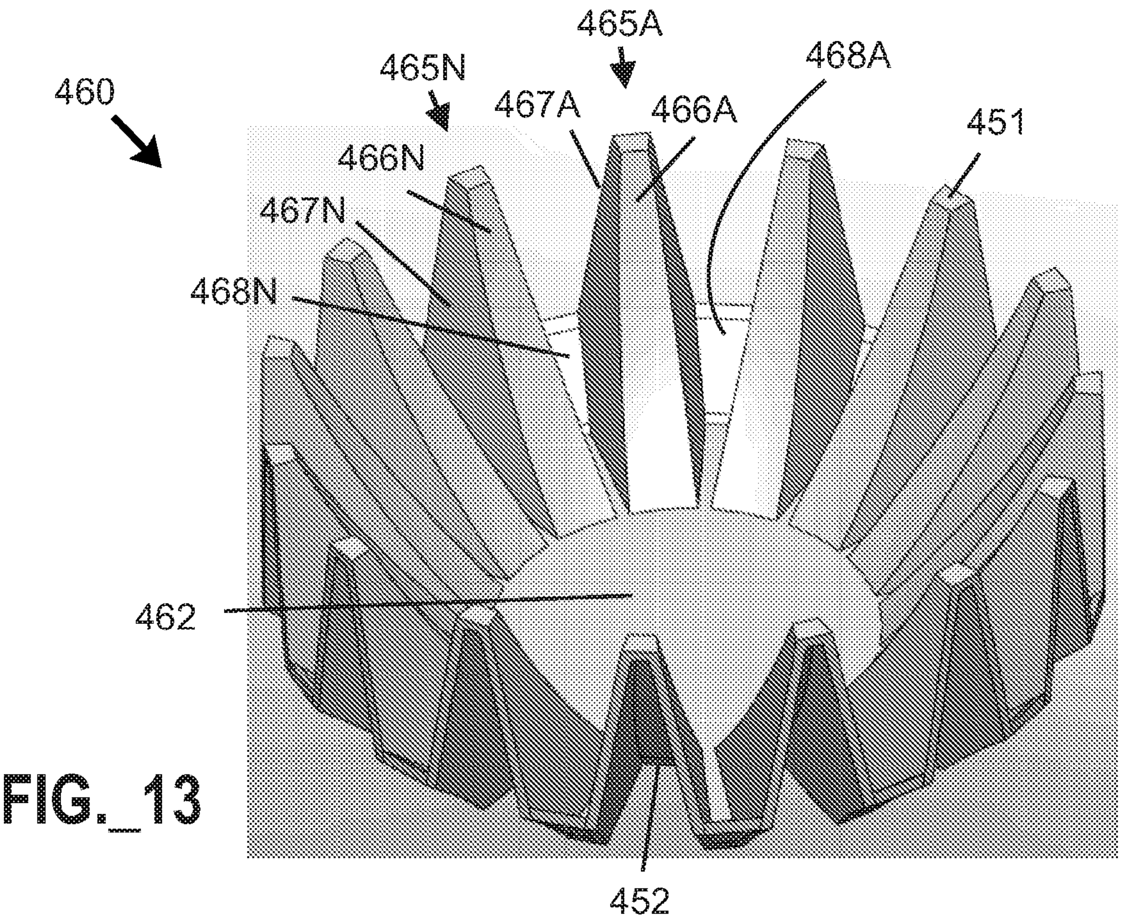
FIG. 13 is an upper perspective view of a third alternative heatsink for a reflector-containing solid state lighting device according to one embodiment of the present invention.

FIG. 13 illustrates a heatsink 460 adapted for use with a reflector-containing solid state lighting device, according to another embodiment. The heatsink 460 includes a substantially flat base portion 462, with alternating truncated sidewall portions 468A-468N and protruding sidewall portions or segments 465A-465N each having a medial surface portion 466A-466N and lateral surface portions 467A-467N. Each protruding sidewall portion or segment 465A-465N is preferably hollow when viewed externally, thus increasing surface area of the heatsink 460. The sidewall portions 465A-465N, 468A-468N in combination with the base portion 462 define a cavity adapted to receive at least a portion of a reflector of a solid state lighting device. One method for forming a heatsink similar to the heatsink 460 may include stamping a blank from a sheet of metal, and then shaping the blank to form the sidewall portions 465A-465N, 468A-468N. Sidewall heights or depths (e.g., with respect to lateral surface portions 467A-467N) may be reduced as compared to the heatsink 460 to promote easier manufacturability utilizing a stamping and shaping method. As compared to the heatsink 160 according to the first embodiment, a heatsink similar to the design of heatsink 460 is expected to exhibit diminished heat transfer capability, ostensibly due to reduced surface area and lack of openings to facilitate air circulation.

Figure 14:
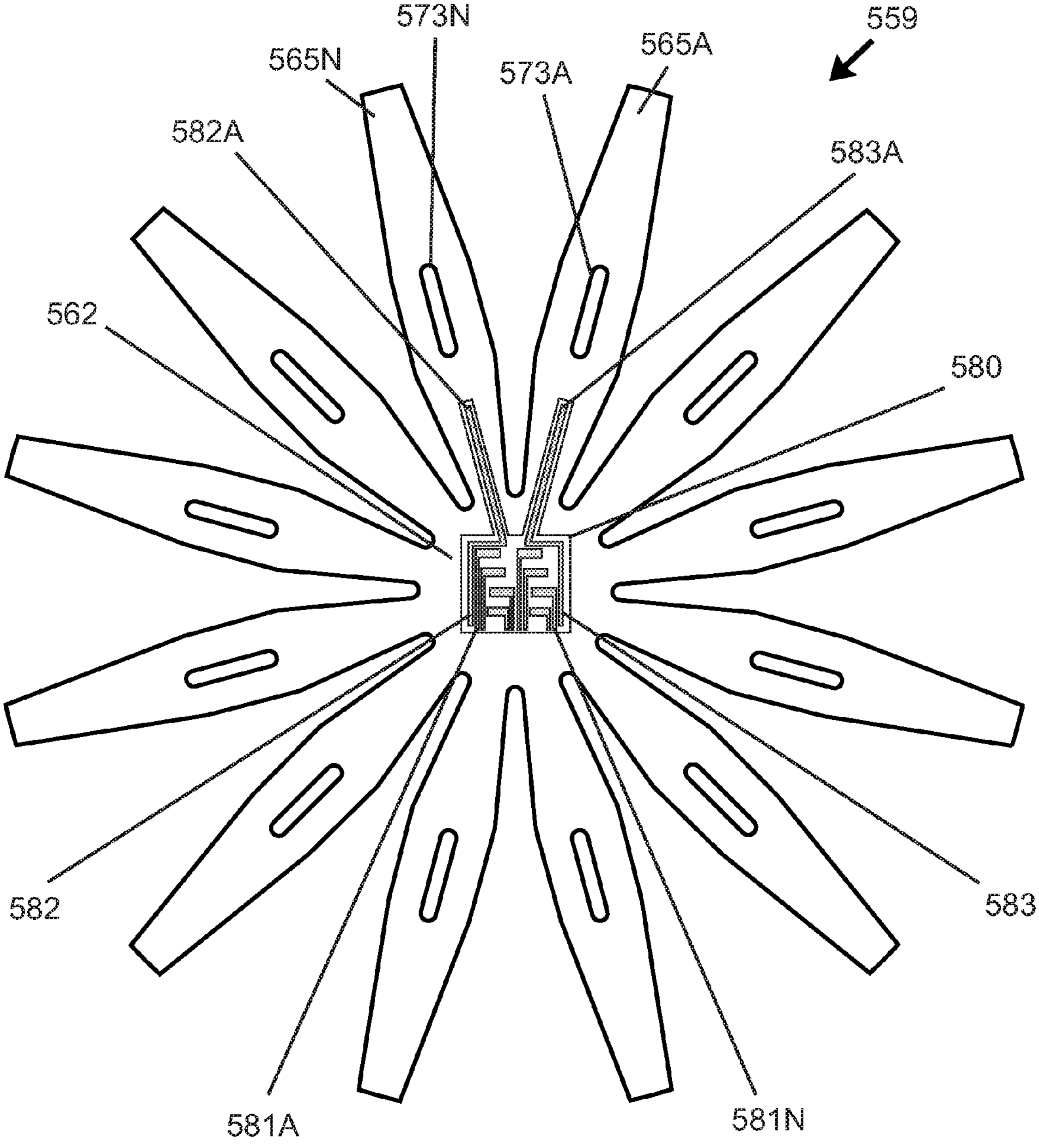
FIG. 14 is a top plan view of a stamped composite sheet including a dielectric layer and electrical traces deposited over the dielectric layer, useable as heatsink (optionally following one or more bending and/or progressive die shaping steps) subject to with integral electrical traces.

In further embodiments, a heatsink adapted for use with a solid state lighting device includes at least one integral electrically conductive trace deposited on or over the heatsink. Referring to FIG. 14, a heatsink 559 includes a base portion 563 and multiple projecting segments 565A-565N that radiate and extend outward from the base portion 563, with each segment 565A-565N defining an aperture 573A-573N therein. Although the heatsink 559 illustrated in FIG. 14 is illustrated as flat and may be used in such a state, it is to be understood that the heatsink 559 is preferably subject to one or more bending and/or progressive die shaping steps to bend the segments 565A-565N and/or the base portion 563 into any desirable shapes. In one embodiment, the segments 565A-565N and the base portion 563 are processed to form a cup-like shape arranged to receive a reflector (not shown) adapted to reflect light emitted by one or more solid state emitters.

The heatsink 559 includes a dielectric (i.e., electrically insulating) layer 580 deposited on or over at least a portion of a metallic sheet (or other sheet of similarly thermally conductive material), and electrically conductive traces 581A-581N, 582, 583 deposited on or over the dielectric layer 580. The dielectric layer 580 may be used to prevent electrical connection between electrically conductive traces 581A-581N, 582, 583 and the metallic sheet from which the heatsink 559 is formed. The electrically conductive traces 581A-581N, 582, 583 may be used to provide electrically conductive paths to one or more electrically operable elements such as one or more solid state emitter(s), sensor(s), and/or solid state emitter drive control component(s) (e.g., providing ballast, color control, and/or dimming utilities). Preferably, at least one solid state emitter is in thermal communication with the heatsink 559 (e.g., through the base portion 562, with the base portion 562 arranged to receive heat from the emitter(s) and conduct such heat to the segments 565A-565N) and in electrical communication with at least one of the electrically conductive traces 581A-581N, 582, 583. Electrical connections between such electrically operable elements and the electrically conductive traces may be made by any suitable methods such as direct soldering, wirebonds, etc. Optionally, one or more vias (i.e., electrically conductive paths penetrating through a surface) may be defined through the dielectric layer and/or the base portion 562 to facilitate electrical connections to components and/or conductors located along or below an opposite face of the base portion 562.

A first dielectric layer 580 may be deposited on or over at least a portion of the thermally conductive sheet including the base portion 562, and a second layer of at least one electrically conductive trace (e.g., copper or another suitable electrically conductive material) may be deposited over the dielectric layer 580, to form a composite sheet. Deposition of the dielectric layer 562 and/or the electrically conductive trace(s) 581A-581N, 582, 583 may be accomplished by any suitable method including printing, sputtering, spray coating, plating, photolithographic patterning/deposition/etching, etc. The composite sheet may be stamped and/or subject to one or more shaping steps (e.g., progressive die shaping, bending, etc.) to form a heatsink 559—whether substantially planar or having one more bent or shaped portions—having integral electrical traces. The ability to pattern dielectric material and electrically conductive traces over a planar metallic sheet, followed by stamping and/or shaping of the resulting composite sheet, promotes easier manufacture of a non-planar heatsink with integral traces than attempting to pattern dielectric and conductor layers over a non-planar heatsink previously subjected to one or more shaping processes.

As shown in FIG. 14, certain electrically conductive traces 582, 583 include extended portions 582A, 583A that extend outward along segments 565N, 565A. If the composite sheet is subject to one or more shaping steps to add bends to the segments 565A-565N (such as shown herein in connection with previous embodiments), then the resulting extended portions 582A, 583A of the electrically conductive traces 582, 583 may extend along sidewall portions that extend in a direction non-parallel to a plane definable through a surface of the base portion. Such electrically conductive extensions 582A, 583A may useful, for example, to provide electrical connections to components distal from the base portion 562, such as one or more sensors and/or auxiliary solid state emitters disposed along or adjacent to a lens of a solid state lighting device.

In one embodiment, a metallic sheet may include electrically conductive traces deposited on or over both sides thereof (optionally including intervening dielectric layers) to provide electrical connections to suitably located electrically operable elements associated with a solid state lighting device.

In one embodiment, a metallic (or other electrically conductive material) sheet from which a heatsink is formed is electrically active, such that one or more electrical connections to electrically operative components include the metallic sheet.

In one embodiment, thermal communication between at least one solid state emitter and a device-scale stamped heatsink may be facilitated by one or more active or passive intervening elements or devices, such as heatpipes, thermoelectric coolers, heat spreaders, and chip-scale heatsinks.

It is to be appreciated that size (including thickness), shape, and conformation of heatsinks may be varied from the designs illustrated herein within the scope of the present invention. In one embodiment, at least three concentric sidewall portions, preferably including apertures to facilitate air circulation, may be formed by stamping one or more sheets of material (or portions of differing size or extent) to form a blank and shaping the blank (e.g., bending) to arrive and the desired shape.

One embodiment of the present invention includes a lamp including at least one solid state lighting device 100 as disposed herein. Another embodiment includes a light fixture including at least one solid state lighting device 100 as disposed herein. In one embodiment, a light fixture includes a plurality of solid state lighting devices. In one embodiment, a light fixture is arranged for recessed mounting in ceiling, wall, or other surface. In another embodiment, a light fixture is arranged for track mounting. A solid state lighting device may be permanently mounted to a structure or vehicle, or constitute a manually portable device such as a flashlight.

In one embodiment, an enclosure comprises an enclosed space and at least one lighting device 100 as disclosed herein, wherein upon supply of current to a power line, the at least one lighting device illuminates at least one portion of the enclosed space. In another embodiment, a structure comprises a surface or object and at least one lighting device as disclosed herein, wherein upon supply of current to a power line, the lighting device illuminates at least one portion of the surface or object. In another embodiment, a lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost.

To demonstrate efficacy of a stamped heatsink according to one embodiment of the present invention, a heatsink consistent with the design of FIG. 6 was fabricated from 0.080 inch type 6063 aluminum alloy, with the heatsink have a diameter of about 4 inches (10.1 cm) and a height of slightly greater than 2 inches (5 cm). Eleven type "XP" light emitting diodes (LEDs) (Cree, Inc., Durham, N.C.) were soldered onto electrical traces of a pad affixed over the base portion of the heatsink, with the LEDs wired in series. The heatsink and LEDs were placed in a box to eliminate forced convection. One thermocouple was mounted to the heatsink along a backside of the base portion of the heatsink directly behind the LEDs. Another thermocouple was attached to one bent segment of the heatsink. Direct current input of about 10 watts was supplied to the LEDs. Voltage drop through the emitters measured, and steady state correlated LED junction temperature of 70.7° C. was calculated from a relationship between forward voltage drop and temperature previously characterized for Cree type XP LED emitters. Steady state temperature of the base portion behind the LEDs (measured via thermocouple) was 63° C., while steady state temperature of the segments (measured via thermocouple) was 53° C. Disparity between the correlated LED junction temperature and the measured base temperature is expected, due at least in part to thermal resistance of the interface between the solid state emitters (LEDs) and the base. The foregoing test demonstrated efficacy of a stamped device-scale heatsink to dissipate substantial thermal load (e.g., 10 W) into a stagnant ambient air environment, while maintaining LED junction temperature well below a target threshold of 85° C. to facilitate long life operation of the LEDs. The 10 Watt DC load supplied to directly to the LEDs is comparable to supply of a 12 Watt DC input to a self-ballasted LED lamp.

It is to be appreciated that any of the elements and features described herein may be combined with any one or more other elements and features.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A solid state lighting device having a first end, the lighting device comprising:
- a solid state emitter adapted to generate a steady state thermal load upon application of an operating current and voltage to the solid state emitter; and
- a heatsink stamped from a sheet of thermally conductive material defining a base portion and a plurality of segments projecting outward from the base portion, wherein the heatsink is mounted in thermal communication with the solid state emitter, and the heatsink is adapted to dissipate substantially all of the steady state thermal load to an ambient air environment;
- wherein the solid state emitter is disposed between the base portion and the first end, and the first end is arranged to transmit light generated by the solid state emitter.

2. The solid state lighting device of claim 1, wherein the steady state thermal load is at least about 4 watts.

3. The solid state lighting device of claim 1, wherein the heatsink is adapted to dissipate at least about 2 Watts in an ambient air environment of about 35° C. while maintaining a junction temperature of the solid state emitter at or below about 95° C.

4. The solid state lighting device of claim 1, wherein each segment of the plurality of segments comprises a plurality of bends.

5. The solid state lighting device of claim 1, wherein the base portion and the plurality of projecting segments form a cup-like shape adapted to receive a reflector arranged to reflect light emitted by the at least one solid state emitter.

6. A lamp or light fixture comprising the lighting device of claim 1.

7. The solid state lighting device of claim 1, further comprising an electrical connection structure comprising at least one of a screw base connector, an electrical plug connector, and at least one terminal adapted to compressively retain an electrical conductor or current source element.

8. A method for fabricating the solid state lighting device of claim 1, the method comprising:
- depositing a first layer of dielectric material over at least a portion of a substantially planar metallic sheet, and depositing a second layer of least one electrically conductive trace over the first layer, to form a composite sheet; and
- processing the composite sheet with at least one of stamping and progressive die shaping to form said heatsink; and
- placing the solid state emitter in thermal communication with said heatsink.

9. A solid state lighting device having a first end, the lighting device comprising:
- at least one solid state emitter; and
- a stamped heatsink in thermal communication with the at least one solid state emitter, wherein the heatsink has a base portion and at least one sidewall portion projecting outward from the base portion, with the at least one sidewall portion extending in a direction non-parallel to a plane definable through a surface of the base portion;
- wherein the at least one solid state emitter is disposed between the base portion and the first end, and the first end is arranged to transmit light generated by the at least one solid state emitter.

10. The solid state lighting device of claim 9, wherein the at least one solid state emitter is adapted to generate a steady state thermal load upon application of an operating current and voltage to the at least one solid state emitter, and the heatsink is adapted to dissipate substantially all of the steady state thermal load to an ambient air environment.

11. The solid state lighting device of claim 9, further comprising a reflector arranged to reflect light emitted by the at least one solid state emitter, wherein the base portion and the at least one sidewall portion form a cup-like shape adapted to receive at least a portion of the reflector.

12. The solid state lighting device of claim 9, wherein the at least one sidewall portion comprises a plurality of spatially segregated sidewall portions.

13. The solid state lighting device of claim 9, wherein the at least one sidewall portion comprises a plurality of bends.

14. The solid state lighting device of claim 9, wherein each of the base portion and the at least one sidewall portion has a substantially constant thickness.

15. The solid state lighting device of claim 9, wherein the base portion defines at least one aperture arranged to receive at least one electrical conductor operatively connected to the at least one solid state emitter.

16. A lamp or light fixture comprising the lighting device of claim 9.

17. A solid state lighting device having a first end, the lighting device comprising:

at least one chip-scale solid state emitter;

a device-scale heatsink stamped from a sheet of thermally conductive material defining a base portion and a plurality of segments projecting outward from the base portion, the device-scale heatsink being in thermal communication with the at least one chip-scale solid state emitter;

wherein the chip-scale solid state emitter is disposed between the base portion and the first end, and the first end is arranged to transmit light generated by the chip-scale solid state emitter.

18. The solid state lighting device of claim 17, further comprising a chip-scale heatsink or heat spreader disposed between the chip-scale solid state emitter and the device-scale heatsink.

19. The solid state lighting device of claim 17, wherein each segment of the plurality of projecting segments includes a portion extending in a direction non-parallel to a plane definable through a surface of the base portion.

20. The solid state lighting device of claim 17, wherein each segment of the plurality of projecting segments comprises a plurality of bends.

* * * * *